United States Patent
Ishihara et al.

(10) Patent No.: US 10,539,379 B2
(45) Date of Patent: Jan. 21, 2020

(54) HEAT DISSIPATION COMPONENT FOR SEMICONDUCTOR ELEMENT

(71) Applicant: DENKA COMPANY LIMITED, Tokyo (JP)

(72) Inventors: Yosuke Ishihara, Omuta (JP); Takeshi Miyakawa, Omuta (JP); Kazunori Koyanagi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 376 days.

(21) Appl. No.: 15/508,187

(22) PCT Filed: Sep. 1, 2015

(86) PCT No.: PCT/JP2015/074843
§ 371 (c)(1),
(2) Date: Jun. 6, 2017

(87) PCT Pub. No.: WO2016/035789
PCT Pub. Date: Mar. 10, 2016

(65) Prior Publication Data
US 2017/0268834 A1 Sep. 21, 2017

(30) Foreign Application Priority Data
Sep. 2, 2014 (JP) .................. 2014-177850

(51) Int. Cl.
*B22F 7/02* (2006.01)
*F28F 21/02* (2006.01)
(Continued)

(52) U.S. Cl.
CPC .............. *F28F 21/02* (2013.01); *B22F 7/06* (2013.01); *C22C 21/02* (2013.01); *C22C 26/00* (2013.01);
(Continued)

(58) Field of Classification Search
None
See application file for complete search history.

(56) References Cited

U.S. PATENT DOCUMENTS

2012/0063071 A1* 3/2012 Loutfy ................ C09K 3/1436
361/679.01
2014/0182824 A1 7/2014 Hirotsuru et al.

FOREIGN PATENT DOCUMENTS

JP  H09-157773 A  6/1997
JP  2000-303126 A  10/2000
(Continued)

OTHER PUBLICATIONS

Dec. 8, 2015 International Search Report issued in International Patent Application No. PCT/JP2015/074843.

*Primary Examiner* — Seth Dumbris
(74) *Attorney, Agent, or Firm* — Oliff PLC

(57) ABSTRACT

A heat dissipation component for a semiconductor element includes: a composite part containing 50-80 vol % diamond powder with the remainder having metal including aluminum, the diamond powder having a particle diameter volume distribution first peak at 5-25 μm and a second peak at 55-195 μm. A ratio between a volume distribution area at particle diameters of 1-35 μm and a volume distribution area at particle diameters of 45-205 μm is 1:9 to 4:6; surface layers on both composite part principal surfaces, each of the surface layers containing 80 vol % or more metal including aluminum and having a film thickness of 0.03-0.2 mm; and a crystalline Ni layer and an Au layer on at least one of the surface layers, the crystalline Ni layer having a film thickness of 0.5-6.5 μm, and the Au layer having a film thickness of 0.05 μm or larger.

16 Claims, 1 Drawing Sheet

(51) Int. Cl.
    *C22C 26/00*     (2006.01)
    *C22C 47/12*     (2006.01)
    *H01L 23/373*     (2006.01)
    *C22C 21/02*     (2006.01)
    *F28F 21/08*     (2006.01)
    *H01L 21/48*     (2006.01)
    *B22F 7/06*     (2006.01)
    *C25D 5/12*     (2006.01)
    *C22C 49/06*     (2006.01)
    *C25D 5/44*     (2006.01)
    *C23C 18/32*     (2006.01)
    *C23C 18/42*     (2006.01)

(52) U.S. Cl.
    CPC ............... *C22C 47/12* (2013.01); *C25D 5/12* (2013.01); *F28F 21/084* (2013.01); *F28F 21/089* (2013.01); *H01L 21/4871* (2013.01); *H01L 23/373* (2013.01); *H01L 23/3732* (2013.01); *H01L 23/3736* (2013.01); *C22C 49/06* (2013.01); *C23C 18/32* (2013.01); *C23C 18/42* (2013.01); *C25D 5/44* (2013.01); *F28F 2255/06* (2013.01); *H01L 2924/0002* (2013.01); *Y10T 428/12056* (2015.01); *Y10T 428/12069* (2015.01)

(56) References Cited

FOREIGN PATENT DOCUMENTS

| | | |
|---|---|---|
| JP | 2007-518875 A | 7/2007 |
| WO | 2005/035808 A2 | 4/2005 |
| WO | 2013/015158 A1 | 1/2013 |

\* cited by examiner

HEAT DISSIPATION COMPONENT FOR SEMICONDUCTOR ELEMENT

TECHNICAL FIELD

The present invention relates to a heat dissipation component for a semiconductor element.

BACKGROUND ART

Generally, in a semiconductor element such as a semiconductor laser element or high-frequency element that is used for optical communication or the like, it is very important how to release the heat generated from the element efficiently, for preventing malfunctions or the like. In recent years, higher outputs, higher speeds, and higher integration of the elements have accompanied progress in semiconductor technology, and the requirements for heat dissipation have grown increasingly stringent. Therefore, generally, also for a heat dissipation component such as a heat sink, a high thermal conductivity is required, and copper (Cu), which has a high thermal conductivity of 390 W/mK, is used.

Meanwhile, each semiconductor element has increased in dimensions accompanying higher outputs, and the problem of mismatch in thermal expansion between the semiconductor element and the heat sink to be used for heat dissipation has become obvious. To solve these problems, the development of a heat sink material that achieves both the high thermal conduction characteristic and the matching of the coefficient of thermal expansion with the semiconductor element are required. As such a material, a composite body of metal and ceramic, for example, a composite body of aluminum (Al) and silicon carbide (SiC), has been proposed (Patent Document 1).

However, in the Al—SiC composite body, the thermal conductivity is 300 W/mK or lower even when the condition is optimized, and the development of a heat sink material having a thermal conductivity higher than the thermal conductivity of copper is required. As such a material, a metal-diamond composite body having a high thermal conductivity and a thermal expansion coefficient close to that of the semiconductor element material by the combination of the high thermal conductivity of diamond and the high coefficient of thermal expansion of metal has been proposed (Patent Document 2).

Further, in Patent Document 3, by forming β-SiC layers on surfaces of diamond particles, the generation of a metal carbide with a low thermal conductivity that is formed at the time of composition is suppressed, and the wettability with molten metal is improved, so that the thermal conductivity of a metal-diamond composite body to be obtained is improved.

Furthermore, since diamond is a very hard material, the metal-diamond composite body obtained by the composition with metal is also very hard, and is a material that is difficult to machine. Therefore, the metal-diamond composite body can hardly be machined by a usual diamond tool, and in order to use the metal-diamond composite body for small-size heat sinks having various shapes, the problem is how to perform the shape machining at low costs. For such a problem, laser machining and water jet machining have been considered, and further, a machining method by electric discharge machining has also been considered because the metal-ceramic composite body is electrically conductive.

Patent Document 1: JP H9-157773 A
Patent Document 2: JP 2000-202126 A
Patent Document 3: JP2007-518875 A

SUMMARY OF INVENTION

In a heat dissipation component for a semiconductor element, for the bonding with the element, a metal layer needs to be added on the surface of the heat dissipation component through plating or the like. In the case of a usual semiconductor element, the bonding is mainly performed by soldering, and the bonding temperature is 300° C. or lower. Therefore, a metal layer of a Ni—P alloy or the like is provided on the surface by plate processing. However, as the use form of a heat sink material such as that of the present invention, the heat sink is usually disposed so as to contact with the semiconductor element while being bonded by a brazing material or the like, in order to efficiently dissipate the heat generated in the semiconductor element. Therefore, a multi-layer plating in which a gold plate is added on the bonded surface, or the like, is used. Furthermore, in the usage in a satellite, a stringent reliability predicated against the actual environment is required, and the conventional alloy plating such as the Ni—P alloy or the like has a problem in that a crack is generated at the bonding temperature accompanying crystallization and further the crack extends along with a hot-cold cycle.

Furthermore, in the case where the heat sink is bonded to the semiconductor element by a brazing material or the like, the surface accuracy of the bonded interface is important for heat dissipation. The conventional metal-diamond composite body is unsuitable because diamond particles are exposed on the bonded surface and therefore the surface roughness of the bonded surface is large, so the thermal resistance at the contact interface unfavorably increases. Therefore, the problem about the required characteristic of the heat sink material is how to reduce the surface roughness of the surface.

That is, an object of the present invention is to provide an aluminum-diamond composite body that has both a high thermal conductivity and a coefficient of thermal expansion close to that of the semiconductor element, that improves the surface flatness of the surface for a suitable use as a heat sink or the like for the semiconductor element, and that avoids the generation of a blister, a crack and the like on the surface metal layer portion even in the actual use at a high load.

Means to Solve the Technical Problem

The present invention provides a heat dissipation component for a semiconductor element, the heat dissipation component including: a composite part containing 50-80 vol % diamond powder with the remainder being composed of metal including aluminum, the diamond powder being a diamond powder in which a first peak of a volume distribution of particle diameter is at 5-25 μm, a second peak is at 55-195 μm, and a ratio between an area of a volume distribution at particle diameters of 1-35 μm and an area of a volume distribution at particle diameters of 45-205 μm is 1:9 to 4:6; surface layers on both principal surfaces of the composite part, the surface layers containing 80 vol % or more metal including aluminum and having a film thickness of 0.03-0.2 mm; and (1) a crystalline Ni layer and (2) an Au layer on at least one of the surface layers, the Ni layer having a film thickness of 0.5-6.5 μm, the Au layer having a film thickness of 0.05 μm or greater.

According to one embodiment of the present invention, in the above heat dissipation component for the semiconductor element, the Ni layer and the Au layer are characterized by being plated films that are formed by plate processing, and in that the peel strengths of the plated films are 50 N/cm or higher.

According to one embodiment of the present invention, in the above heat dissipation component for the semiconductor element, the semiconductor element to be mounted is characterized in being a semiconductor laser element or high-frequency element that comprises GaN, GaAs or SiC.

According to one embodiment of the present invention, in the above heat dissipation component for the semiconductor element, the composite part is characterized in being an aluminum-diamond composite body produced by a squeeze casting method, and in that the aluminum-diamond composite body has a thermal conductivity of 400 W/mK or higher at a temperature of 25° C. and has a linear thermal expansion coefficient of $5.0 \times 10^{-6}$-$10.0 \times 10^{-6}$/K at a temperature of 25-150° C., and both principal surfaces have a surface roughness (Ra) of 1 µm or less.

According to one embodiment of the present invention, in the above heat dissipation component for the semiconductor element, characterized in that the composite part is an aluminum-diamond composite body in which a particle of the diamond powder is characterized by existence of a β-silicon carbide layer chemically bonded to a surface of the particle.

The aluminum-diamond composite body according to the present invention has a high thermal conductivity and a coefficient of thermal expansion close to that of the semiconductor element, and further, can suppress the generation of a blister, a crack and the like on the surface metal layer portion even in the actual use at a high load, and therefore, is suitably used as a heat sink for the heat dissipation of the semiconductor element, or the like.

DESCRIPTION OF EMBODIMENTS

[Explanation of Terms]

In the description, sign "-" means "equal to or more than" and "equal to or less than". For example, "A-B" means "equal to or more than A and equal to or less than B".

In the description, "both surfaces" means both of the front surface and back surface of a plate-shaped member. In the description, "lateral surface portion" means a portion that is at the periphery of the above both surfaces of a plate-shaped member and that is nearly perpendicular with respect to both surfaces. In the description, "principal surface" means either surface of the front surface and back surface of a plate-shaped member.

Hereinafter, an embodiment of an aluminum-diamond composite body according to the present invention, a heat dissipation component using this, and a production method for them will be described with reference to FIGS. 1 and 2.

Figure 1:
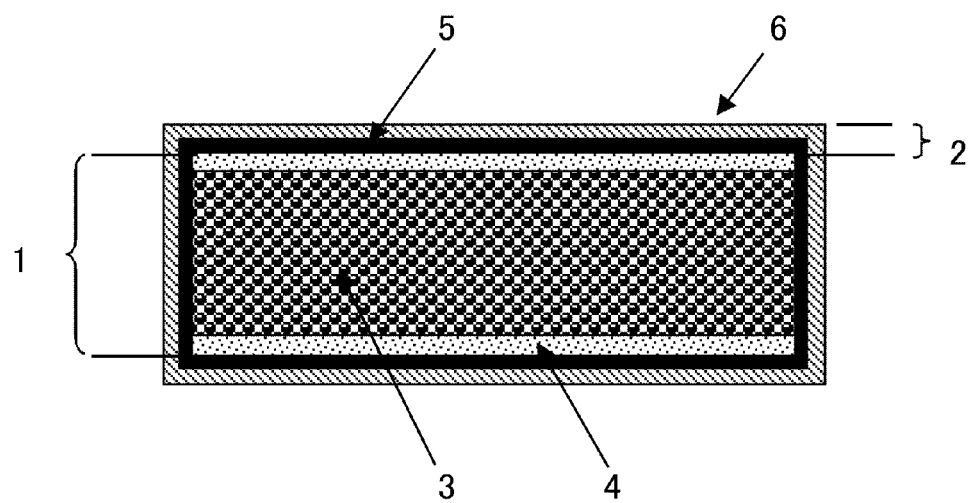
FIG. 1 is a conceptual structural diagram of a heat dissipation component for a semiconductor element according to an embodiment of the present invention.

A heat dissipation component for a semiconductor element according to the present embodiment is constituted by an aluminum-diamond composite body (reference numeral 1 in FIG. 1) and a surface metal layer (reference numeral 2 in FIG. 1). The aluminum-diamond composite body to be used in the heat dissipation component is a plate-shaped aluminum-diamond composite body that contains diamond particles and metal including aluminum, and the above aluminum-diamond composite body 1 comprises a composite part (reference numeral 3 in FIG. 1) and a surface layer (reference numeral 4 in FIG. 1) provided on both surfaces of the above composite part 3. The above surface layer 4 comprises a material that contains metal including aluminum, and the content of the above diamond particles is 50-80 vol % of the whole of the above aluminum-diamond composite body 1.

The thus-configured heat dissipation component for the semiconductor element has a high thermal conductivity and a coefficient of thermal expansion close to that of the semiconductor element, and can suppress the generation of a blister and the like on the surface metal layer portion even in the actual use at a high load. Therefore, the aluminum-diamond composite body according to the present embodiment is suitably used as a heat dissipation component such as a heat sink for the heat dissipation of the semiconductor element.

The heat dissipation component for the semiconductor element according to the present embodiment may include a surface metal layer 2 comprising a crystalline Ni layer (reference numeral 5 in FIG. 1) and an Au layer (reference numeral 6 in FIG. 1).

Hereinafter, a production method by a squeeze casting method for the aluminum-diamond composite body according to the present embodiment will be described.

Here, the production method for the aluminum-diamond composite body falls roughly into two kinds: an impregnation method and a powder metallurgy method. In view of the characteristics such as thermal conductivity, many of the actual commercial products are produced by the impregnation method of the two. The impregnation method falls into various kinds, and there is a method performed under a normal pressure and a high-pressure forging method performed under a high pressure. The high-pressure forging method falls includes a squeeze casting method and a die casting method.

A method suitable for the present embodiment is the high-pressure forging method in which the impregnation is performed under a high pressure, and the squeeze casting method is preferable for obtaining a dense composite body that is excellent in the characteristics such as thermal conductivity. The squeeze casting method is generally a method of obtaining a composite material by putting a powder or compact of diamond or the like in a high-pressure container and impregnating this with a hot metal of an aluminum alloy or the like under a high temperature and a high pressure.

[Diamond Powder]

The diamond powder is a raw material of the aluminum-diamond composite body, and both a natural diamond powder and a synthetic diamond powder can be used. As necessary, for example, a binder such as silica may be added in the diamond powder. By the addition of the binder, it is possible to obtain the effect of being able to form a compact.

As for the particle size of the diamond powder, from the standpoint of the thermal conductivity, it is preferable that the particle diameter at the first peak of the volume distribution of the particle diameter be 5-25 µm, the particle diameter at the second peak be 55-195 µm and that the ratio between the area of the volume distribution at 1-35 µm that contains the first peak of the volume distribution and the area of the volume distribution at 45-205 µm that contains the second peak be 1:9 to 4:6.

As for the distribution of the particle diameter, it is further preferable that the particle diameter at the first peak be 10-20 μm and that the particle diameter at the second peak be 100-180 μm. TO increase the filling content of diamond, the above ratio is preferable, but 2:8 to 3:7 is further preferable. The particle size distribution measurement is performed using a Coulter method.

It is preferable that the content of the diamond particle in the aluminum-diamond composite body be 50 vol % or more and 80 vol % or less. If the content of the diamond particle is 50 vol % or more, it is possible to sufficiently secure the thermal conductivity of the aluminum-diamond composite body to be obtained. Further, in view of the filling property, it is preferable that the content of the diamond particle be 80 vol % or less. If the content is 80 vol % or less, it is not necessary to process the shape of the diamond particle into a spherical shape or the like, and it is possible to obtain the aluminum-diamond composite body at a stable cost.

In the composite body obtained by the squeeze casting method, since the hot metal reaches gaps among the powders if the conditions are appropriate, the ratio of the volume of the powder to the filling volume is nearly equal to the volume (particle content) of the powder material to the whole volume of the obtained composite body.

Furthermore, by using a diamond powder in which a β-silicon carbide layer is formed on the surface of the above diamond particle, it is possible to suppress the generation of a metal carbide ($Al_4C_3$) with a low thermal conductivity that is formed at the time of composition, and it is possible to improve the wettability with hot aluminum. As a result, it is possible to obtain the effect of the enhancement of the thermal conductivity of the obtained aluminum-diamond composite body.

Figure 2:
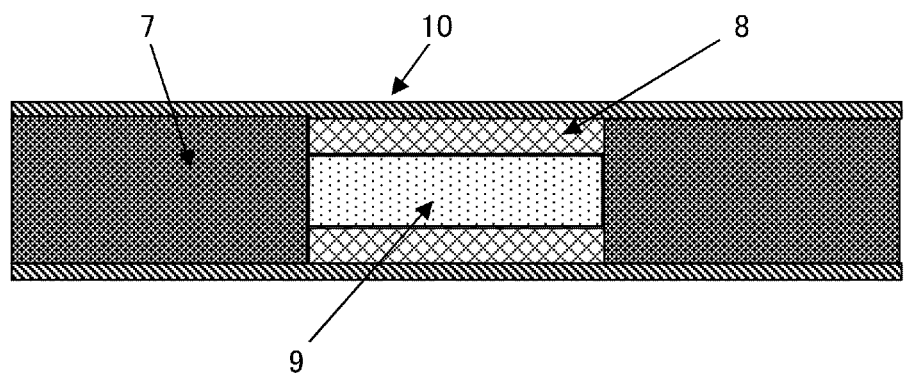
FIG. 2 is a conceptual cross-section diagram of a structure before the composition of a composite part of the heat dissipation component for the semiconductor element according to an embodiment of the present invention.

As the preparation for the squeeze casting, a mold member (reference numeral 7 in FIG. 2) comprising a porous body that can be impregnated with an aluminum alloy, dense mold release plates (reference numeral 8 in FIG. 2) on which a mold release agent is applied, and the above diamond powder (reference numeral 9 in FIG. 2) are disposed as shown in FIG. 2, and thereby, a structure for the squeeze casting that comprising the mold member 7, the mold release plates 8, and the filled diamond powder 9 is obtained.

Here, FIG. 2 is a cross-section diagram of the structure for the squeeze casting, and is a cross-section diagram of a portion into which the above diamond powder is filled. Incidentally, at the time of the composition of the aluminum alloy and the diamond powder in the squeeze casting method, the aluminum alloy reaches the portion into which the diamond powder is filled, through the above mold member comprising the porous body.

[Mold Member Comprising Porous Body]

Here, as the material of the mold member 7 comprising the porous body that can be impregnated with the aluminum alloy by the squeeze casting method is not particularly limited if it is a porous body that can be impregnated with the aluminum alloy by the squeeze casting method. However, as the porous body, it is preferable to use a porous body composed of graphite, boron nitride, alumina fiber or the like that has a good thermal resistance and allows for a stable supply of the hot metal.

[Mold Release Plate]

Furthermore, as the dense mold release plate 8, a stainless-steel plate or a ceramic plate can be used, and is not particularly limited if it is a dense body that is not impregnated with the aluminum alloy by the squeeze casting method. As the mold release agent that is applied on the mold release plate, it is preferable to use a mold release agent composed of graphite, boron nitride, alumina or the like that has a good thermal resistance. Moreover, by applying the above mold release agent after coating the surface of the mold release plate with an alumina sol or the like, it is possible to obtain a mold release plate allowing for a more stable mold release.

[Aluminum Alloy]

It is preferable that the aluminum alloy (metal including aluminum) in the aluminum-diamond composite body according to the present embodiment has a melting point as low as possible in order to sufficiently penetrate gaps among the diamond powder (intervals among the diamond particles) at the time of the impregnation. Examples of the aluminum alloy include an aluminum alloy containing, for example, 5-25 mass % silicon. By using the aluminum alloy containing 5-25 mass % silicon, it is possible to obtain the effect of the promotion of the densification of the aluminum-diamond composite body.

Furthermore, by including magnesium in the above aluminum alloy, the bonding of the diamond particle and ceramic particle to the metal portion is strengthened, which is preferable. Concerning the metal components other than aluminum, silicon, and magnesium in the aluminum alloy are not particularly limited unless the characteristic of the aluminum alloy is extremely changed, and for example, copper or the like may be contained.

In the aluminum-diamond composite body according to the present embodiment, the thickness can be adjusted by the filling content of the diamond powder at the time of the composition, and it is preferable that the thickness be 0.4-6 mm. A thickness of less than 0.4 mm is not preferable, because a sufficient strength for the use as a heat sink or the like cannot be obtained. A thickness of greater than 6 mm is not preferable, because the material itself becomes expensive and the effect of the high thermal conductivity cannot be sufficiently obtained.

The present embodiment is characterized by removing the mold release plates 8 disposed on both surfaces after the composition. By such a characteristic configuration, it is possible to obtain an aluminum-diamond composite body having very smooth surfaces.

As shown in FIG. 2, metal plates (reference numeral 10 in FIG. 2) may be disposed on both surfaces of the above structure. Further, in the case of laminating a plurality of structures to form a block, the structures may be laminated with the metal plates 10 therebetween. By such a disposition of the mold release plates, it is possible to uniformly perform the impregnation of the hot metal, and it is possible to easily perform operations such as the removal of the aluminum-diamond composite body after the impregnation treatment.

A plurality of sheets of the obtained structures is further laminated such that a block is formed, and the block is heated at about 600-750° C. Then, a single or two or more blocks are disposed in a high-pressure container, the hot metal of the aluminum alloy heated to the melting point or higher is supplied as quickly as possible to prevent the decrease in the temperature of the blocks, and the pressurization is performed at a pressure of 20 MPa or higher.

Here, if the block heating temperature is 600° C. or higher, the composition of the aluminum alloy becomes stable, and it is possible to obtain an aluminum-diamond composite body having a sufficient thermal conductivity. If the heating temperature is 750° C. or lower, it is possible to suppress the generation of aluminum carbide ($Al_4C_3$) on the surface of the diamond powder at the time of the composition with the aluminum alloy, and it is possible to obtain an aluminum-diamond composite body having a sufficient thermal conductivity.

Further, concerning the pressure at the time of the impregnation, if it is 20 MPa or higher, the composition of the aluminum alloy stabilizes, and it is possible to obtain an aluminum-diamond composite body having a sufficient thermal conductivity. Further preferably, the impregnation pressure should be 50 MPa or higher. In the case of 50 MPa or higher, it is possible to obtain an aluminum-diamond composite body having a more stable thermal conductivity characteristic.

[Annealing Treatment]

For the aluminum-diamond compact obtained by the above operation, an annealing treatment may be performed. By performing the annealing treatment, the distortion in the above aluminum-diamond compact is removed, and it is possible to obtain an aluminum-diamond composite body having a more stable thermal conductivity characteristic.

In order to remove only the distortion in the compact without affecting the surface of the obtained aluminum-diamond compact, it is preferable to perform the above annealing treatment under the condition of a temperature of 400-550° C. for 10 minutes or more.

[Machining Method]

Next, examples of the machining method for the aluminum-diamond composite body according to the present embodiment will be described. The above aluminum-diamond composite body is a very hard material that is difficult to machine. Therefore, it is difficult to perform a usual machining operation or a grinding with use of a diamond tool, and the machining is performed by water jet machining, laser machining, or electric discharge machining.

Incidentally, for the aluminum-diamond compact according to the present embodiment, a usual machining with use of a diamond tool or the like is also possible. However, because it is a very hard material that is difficult to machine, it is preferable to perform the water jet machining, the laser machining or the electric discharge machining, in view of the durability of the tool and the machining cost.

[Surface Layer]

The aluminum-diamond composite body according to the present embodiment is characterized in that both surfaces of the composite part (reference numeral 3 in FIG. 1) are coated with the surface layers (reference numeral 4 in FIG. 1) comprising a material that contains the metal including aluminum (aluminum alloy).

Here, the above surface layer 4 comprises a material that mainly contains the metal including aluminum, but substances other than the metal including aluminum may be contained. That is, the above diamond particles, other impurities or the like may be contained.

However, it is preferable that the diamond particles do not exist in the portion of 0.01 mm from the surface of the surface layer 4. By such a configuration, it is possible to employ a processing method that is employed in usual metal processing, and it is possible to smooth the surface layer 4 with no polishing flaws.

The above surface layer 4 contains 80 vol % or more metal including aluminum. If the content of the metal including aluminum is 80 vol % or more, it is possible to employ a processing method that is employed in usual metal processing and it is possible to perform the polishing of the surface layer 4. Furthermore, it is preferable that the content of the metal including aluminum be 90 vol % or more. If the content of the metal including aluminum is 90 vol % or more, impurities and others in the interior do not desorb at the time of the polishing of the surface, so that a polishing flaw is not generated.

As for the thickness of the above surface layer 4, it is preferable that the average thickness be 0.03 mm or larger and 0.2 mm or smaller. If the average thickness of the above surface layer 4 is 0.03 mm or larger, a target surface accuracy and plating properties are easily obtained without the diamond particles being exposed in the subsequent processes. If the average thickness of the surface layer 4 is 0.2 mm or smaller, it is possible to obtain a sufficient thickness of the composite part 3 in the obtained aluminum-diamond composite body 1, and to secure a sufficient thermal conductivity.

The total of the average thicknesses of the surface layers 4 on both surfaces is preferably 20% or less of the thickness of the aluminum-diamond composite body 1, and further preferably, is 10% or less. If the total of the average thicknesses of the surface layers 4 on both surfaces is 20% or less of the thickness of the aluminum-diamond composite body 1, it is possible to obtain a sufficient thermal conductivity, in addition to the surface accuracy and the plating properties.

The thickness of the above surface layer 4 may be adjusted, by disposing a ceramic fiber such as an alumina fiber between the diamond powder and the dense mold release plate on which the mold release agent is applied, at the time of filling of the diamond powder, and performing the composition with the aluminum alloy. The adjustment can be performed also by using an aluminum foil, instead of the ceramic fiber.

[Surface Layer Processing]

The aluminum-diamond composite body according to the present embodiment has a structure in which both surfaces are coated with the surface layers 4 comprising the material that contains the metal including aluminum, and therefore, it is possible to adjust the surface accuracy (surface roughness: Ra) by processing (polishing) the surface layers 4. In the processing of the surface layer 4, it is possible to employ a processing method that is employed in usual metal processing, and for example, it is possible to obtain a surface roughness of 1 µm or less by polishing with use of a buffing machine.

Furthermore, by processing the surface layer 4, it is possible to adjust the average thickness of the surface layer. In the case where the aluminum-diamond composite body according to the present embodiment is used as a heat dissipation component such as a heat sink, it is preferable that the surface be a smooth surface with a small surface roughness, in consideration of the thermal resistance of the bonded surface. The surface roughness (Ra) preferably should be 1 µm or less, and further preferably should be 0.5 µm or less. When the surface roughness is 1 µm or less, it is possible to uniform the thickness of the bonding layer, and to obtain higher heat dissipation properties.

The flatness of the above surface layer 4, converted to the size of 50 mm×50 mm, preferably is 30 µm or less, and further preferably is 10 µm or less. When the flatness is 30 µm or less, it is possible to uniform the thickness of the bonding layer, and to obtain a higher heat dissipation property.

[Composite Part]

The aluminum-diamond composite body according to the present embodiment includes the composite part (reference numeral 3 in FIG. 1) of the above diamond particles and the aluminum alloy. In the aluminum-diamond composite body having such a structure, stress is unlikely to be generated between the above surface layer 4 and the composite part 3, and the surface layer 4 is not broken when force is applied by polishing or the like.

[Surface Metal Layer]

In the case of the use as the heat sink for the semiconductor element, the aluminum-diamond composite body according to the present embodiment is often used while being bonded to the semiconductor element by brazing. Therefore, on the bonded surface of the aluminum-diamond composite body, the surface metal layer needs to be provided. As the formation method for the surface metal layer, methods such as a plating method, an evaporation method, and a sputtering method can be employed. In view of the processing costs, the plating method is preferable.

Below, the plating method will be described.

First, the metal including aluminum on the surface of the aluminum-diamond composite body is plated with a crystalline Ni having a film thickness of 0.5-6.5 As the plating method, an electroplating method is preferable, but an electroless plating method may be employed as long as the crystalline Ni plate film can be obtained. If the film thickness of the Ni plate is smaller than 1 µm, a pinhole (plating incompletion portion) of the plate film is generated, and therefore, the film thickness is not preferable. In the case of exceeding 6.5 µm, the residual stress generated in the plate film increases, and in the usage such as that of the present embodiment, there is a problem in that the temperature load at the time of the actual use generates a blister, separation or crack of the plate film. Therefore, the film thickness is not preferable.

Furthermore, when the Ni plating is performed on aluminum, it is necessary to perform a pretreatment such as a zinc substitution, and it is preferable to perform a zinc substitution that exerts a good plate adhesion. As for the adhesion of the Ni plate, the peel strength is preferably 50 N/cm or higher, and further preferably is 78 N/cm or higher. In the case of the use as a heat dissipation component for a semiconductor element, a peel strength of lower than 50 N/cm sometimes causes a problem in that the plate layer is separated by the temperature load at the time of the actual use, and therefore, is not preferable.

Since the machining is performed by the water jet machining, the laser machining or the electric discharge machining, the aluminum-diamond composite body in the present invention has a structure in which the diamond is exposed on the lateral surface. In the formation of the Ni plate layer by electroplating, the plate film is not formed on the diamond particle of the lateral surface, and the pinhole is generated. Therefore, it is necessary to form an amorphous Ni alloy layer on the Ni plate surface by electroless plating. However, in the case where the amorphous Ni alloy layer exists, there is a problem in that the amorphous Ni alloy layer crystallizes accompanying the rise in the bonding temperature or the increase in the temperature load at the time of the actual use, the volume change at that time generating a microcrack, and the subsequent temperature load extending the crack. Although efforts to improve have been made by thinning the Ni alloy layer as much as possible, the temperature load extends the crack generated with the crystallization regardless of the thickness of the Ni alloy layer, particularly in a hot-cold cycle required for the usage in a satellite or the like. Therefore, it is not preferable to form the amorphous Ni alloy layer.

Since the formation of the amorphous Ni alloy layer by electroless plating is not performed, the plate film is not formed on the diamond particles of the lateral surface. However, the usage in a satellite or the like gives importance to the airtightness after packaging, and preferentially requires the formation of a metal layer in which the pinhole and the crack in the actual use do not exist on both principal surfaces on each of which the semiconductor element is bonded.

Furthermore, in the usage as a heat dissipation component for a high-output semiconductor element, there is a problem in that the blister is generated accompanying the rise in the bonding temperature and the increase in the temperature load at the time of actual use, due to the thermal expansion difference between the surface layer containing aluminum and the plate film. Further, the crystalline Ni plate layer is smaller than the Ni alloy plate layer in the thermal expansion difference from the surface layer containing aluminum, and by forming the Ni plate layer having a low hardness, it is possible to suppress the generation of the blister by the temperature load at the time of actual use.

Since the machining is performed by the water jet machining, the laser machining, or the electric discharge machining, the aluminum-diamond composite body according to the present embodiment has a structure in which the diamond is exposed on the lateral surface. In the case of the formation of the Ni plate layer by electroplating, the plate film is not formed on the diamond particles of the lateral surface, and the pinhole is generated.

In the case of performing the braze bonding at a high temperature, it is preferable to provide an Au plate having a film thickness of 0.05-4 µm on the outermost surface, by the electroplating method or the electroless plating method. A plate film thickness of smaller than 0.05 µm results in an insufficient bonding, and is not preferable. As for the upper limit, there is no limit by the characteristic, but the Au plate, which is very expensive, preferably should be 4 µm or smaller.

In the aluminum-diamond composite body according to the present embodiment, it is preferable that the thermal conductivity when the temperature of the aluminum-diamond composite body is 25° C. be 400 W/mK or higher, and the thermal expansion coefficient at 25-150° C. be $5.0$-$10.0 \times 10^{-6}$/K.

If the thermal conductivity at 25° C. is 400 W/mK or higher and the thermal expansion coefficient at 25-150° C. is $5.0$-$10.0 \times 10^{-6}$/K, a high thermal conductivity and a low expansion rate equivalent to the semiconductor element are obtained. Therefore, in the use as the heat dissipation component such as the heat sink, the heat dissipation property is excellent, and the difference in coefficient of thermal expansion between the semiconductor element and the heat dissipation component is small even at the time of the temperature change. Therefore, it is possible to suppress breakage of the semiconductor element. As a result, the heat dissipation component is suitably used with a high reliability.

[Semiconductor Element]

The heat dissipation component with the aluminum-diamond composite body in the present embodiment has a high thermal conductivity and a low coefficient of thermal expansion equivalent to the semiconductor element, and is suitable as a heat dissipation component for a semiconductor laser element or high-frequency element that is composed of GaN, GaAs, SiC or the like and in which a high output is required. This is particularly suitable as a heat dissipation component for a GaN-HEMT element or a GaAs-HEMT element, which are high-frequency element.

Thus, the aluminum-diamond composite body according to the present invention, the heat dissipation component using this, and the production method for them have been described with the embodiment as an example, but the present invention is not limited to them.

EXAMPLES

In the following, the present invention will be described in more detail, with Examples and Comparative Examples. However, the present invention is not limited to these.

Examples 1-13, Comparative Examples 1-4

A commercially available high-purity diamond powder A (Diamond Innovations, Inc./grade MBG600) and high-purity diamond powder B (Diamond Innovations, Inc./grade MBM) that have average particle diameters shown in Table 1 were mixed at a weight ratio of 7:3. The peak of the volume distribution of the particle diameter of each powder appeared at the same position as the average particle diameter. As a result of the particle size distribution measurement of the mixed powder of the diamond powder A and the diamond powder B, the ratio between the area of the volume distribution at 1-35 μm and the area of the volume distribution at 45-205 μm in the volume distribution was 3:7. In the measurement of the particle size distribution, a slurry was made as a measurement solution, by adding the diamond powders in pure water. Then, the measurement was performed by a spectrophotometer (Beckman Coulter, Inc.: Coulter LS230). The refraction index of the water was 1.33 and the refraction index of the diamond was 2.42.

TABLE 1

| | Average Particle Diameter (μm) | |
|---|---|---|
| | Diamond Powder A | Diamond Powder B |
| Example1 | 130 | 15 |
| Example2 | 130 | 5 |
| Example3 | 130 | 10 |
| Example4 | 130 | 20 |
| Example5 | 130 | 25 |
| Example6 | 55 | 15 |
| Example7 | 60 | 15 |
| Example8 | 80 | 15 |
| Example9 | 100 | 15 |
| Example10 | 90 | 15 |
| Example11 | 150 | 15 |
| Example12 | 180 | 15 |
| Example13 | 195 | 15 |
| Comparative Example 1 | 50 | 10 |
| Comparative Example 2 | 210 | 10 |
| Comparative Example 3 | 130 | 2 |
| Comparative Example 4 | 130 | 35 |

Next, a stainless-steel plate (SUS430 material) of 40×40×2 mmt was coated with an alumina sol. After a baking process was performed at 350° C. for 30 minutes, a graphite mold release agent was applied on the surface, so that a mold release plate (reference numeral 9 in FIG. 2) was made. Then, an isotropic graphite jig (reference numeral 7 in FIG. 2) having an outer shape of 60×60×8 mmt, having a hole of 40×40×8 mmt at the central portion and having a porosity of 20% was filled with each diamond powder in Table 1, with pure aluminum foils having a thickness of 0.03 mm disposed on upper and lower sides thereof such that both surfaces were sandwiched between the mold release plates 8, so that a structure was formed.

A plurality of the structures was laminated so as to sandwich a stainless-steel plate (reference numeral 10 in FIG. 2) of 60×60×1 mmt on which a graphite mold release agent was applied, and iron plates having a thickness of 12 mm were disposed on both sides. They were connected by six M10 bolts, and were tightened by a torque wrench such that the tightening torque in the plane direction was 10 Nm, so that one block was obtained.

Next, the obtained block was preheated to a temperature of 650° C. in an electric furnace, and thereafter, was put in a previously heated press die having an inner diameter of 300 mm. A hot metal of an aluminum alloy containing 12 mass % silicon and 1 mass % magnesium and having a temperature of 800° C. was poured, and pressurization was performed at a pressure of 100 MPa for 20 minutes such that the diamond powder was impregnated with the aluminum alloy. Then, after cooling to room temperature, cutting was performed along the shape of the mold release plate with a wet band saw, and the sandwiched stainless-steel plates were taken off. Thereafter, the annealing treatment was performed at a temperature of 530° C. for 3 hours to remove distortions at the time of impregnation, so that an aluminum-diamond composite body was obtained.

For the obtained aluminum-diamond composite body, both surfaces were polished by a #600 polishing paper, and thereafter, buffing was performed.

Subsequently, by a water jet machine (Abrasive Jet Cutter NC manufactured by Sugino Machine Limited), the aluminum-diamond composite body was machined into a shape of 25×25×2 mmt, under the conditions of a pressure of 250 MPa and a machining speed of 50 mm/min, using a garnet having a particle size of 100 μm as a polishing abrasive grain.

A cross-section of the obtained aluminum-diamond composite body was observed by an industrial microscope, the thickness was measured at regular intervals, for five spots including the center point and both ends of the surface layers (reference numeral 4 in FIG. 1) on both surfaces, and the average thickness was obtained. As a result, the thicknesses of each of the samples were 0.03 mm. Further, the surface roughness (Ra) was measured by a surface roughness meter. The results are shown in Table 2.

Further, a specimen (3×2×10 mm) for thermal expansion coefficient measurement and a specimen (25×25×2 mmt) for thermal conductivity measurement were made by water jet machining. Using the specimens, the thermal expansion coefficient at a temperature of 25-150° C. was measured by a thermal expansion meter (Seiko Instruments Inc.; TMA300), and the thermal conductivity at 25° C. was measured by a laser flash method (Rigaku Corporation; LF/TCM-8510B). The results are shown in Table 2. In Comparative Examples 1-4, the thermal conductivity was 400 W/mK or lower, and the thermal expansion coefficient was 10.0×10$^{-6}$/K or higher.

Further, the density of the obtained aluminum-diamond composite body at the room temperature 25° C. was measured by the Archimedes method, and Vf (the content of the diamond particles) was calculated using the mixturing rule. The results are shown in Table 2 (the diamond density: 3.52 g/cm$^3$, the aluminum alloy density: 2.7 g/cm$^3$).

TABLE 2

| | Surface Roughness/ Ra (μm) | Thermal Conductivity (W/mK) | Thermal Expansion Coefficient (×10$^{-6}$/K) | Vf (vol %) |
|---|---|---|---|---|
| Example1 | 0.32 | 585 | 7.0 | 62 |
| Example2 | 0.3 | 560 | 7.2 | 61 |

TABLE 2-continued

| | Surface Roughness/ Ra (μm) | Thermal Conductivity (W/mK) | Thermal Expansion Coefficient (×10$^{-6}$/K) | Vf (vol %) |
|---|---|---|---|---|
| Example3 | 0.28 | 570 | 7.1 | 62 |
| Example4 | 0.3 | 572 | 7.1 | 62.5 |
| Example5 | 0.25 | 565 | 7.2 | 61 |
| Example6 | 0.35 | 530 | 7.6 | 55 |
| Example7 | 0.33 | 545 | 7.6 | 57 |
| Example8 | 0.33 | 550 | 7.6 | 57.5 |
| Example9 | 0.32 | 560 | 7.3 | 59 |
| Example10 | 0.32 | 550 | 7.5 | 59 |
| Example11 | 0.35 | 588 | 6.9 | 63 |
| Example12 | 0.28 | 575 | 7.0 | 62.5 |
| Example13 | 0.25 | 570 | 7.2 | 61.5 |
| Comparative Example 1 | 0.3 | 395 | 10.1 | 45 |
| Comparative Example 2 | 0.33 | 396 | 10.2 | 46.5 |
| Comparative Example 3 | 0.33 | 390 | 10.4 | 43 |
| Comparative Example 4 | 0.3 | 395 | 10.3 | 44.5 |

Further, ultrasonic cleaning of the above aluminum-diamond composite body was performed, and then, pretreatment with a Zn catalyst was performed. Thereafter, the Ni electroplating and the Au electroplating were performed. Thereby, plate layers having a thickness of 6.5 μm (Ni: 2.5 μm+Au: 2.0 μm) were formed on the surfaces of the aluminum-diamond composite bodies according to Examples 1-13. For the obtained plated products, the peel strength of the plated product was measured in accordance with JIS 8504. As a result, in all plated products, the peel strength was 98 N/cm or higher. In the measurement of the peel strength, on the surface of the aluminum-diamond composite body on which the plate film was formed, a portion other than a measurement portion having a width of 5 mm was masked by a temperature-resistant tape, and a copper plate having a thickness of 0.25 mm and a width of 5 mm was soldered on the measurement portion. Then, the tensile strength was measured by pulling the copper plate exactly upward by a digital force gauge, and the peel strength was calculated. Furthermore, the obtained plated product was heated at a temperature of 400° C. under the atmosphere for 10 minutes, and thereafter, the plate surface was observed. As a result, an abnormity such as a blister was not recognized. Further, after 1000 cycles of a heat cycle of −65° C. to 175° C. (in an air tank, each temperature was kept for 30 minutes), the generation of a crack on the plate surface was not recognized.

As shown in Table 2, each of the aluminum-diamond composite bodies according to Examples 1-13 is very smooth, with a surface roughness of 1 μm or less, and has a high thermal conductivity and a thermal expansion coefficient close to that of the semiconductor element.

Examples 14-19, Comparative Examples 5-7

Ultrasonic cleaning of aluminum-diamond composite bodies made by the same method as Example 1 was performed, and then, pretreatment with the Zn catalyst was performed. Thereafter, a Ni electroplate and an Au electroplate were formed in this order. The thicknesses of the plate films are shown in Table 3. Further, in Comparative Example 7, after the Ni electroplating, a Ni—P electroless plate film was formed.

TABLE 3

| | Plate Film Thickness (μm) | | |
|---|---|---|---|
| | Ni Electroplate | Ni—P Electroless Plate | Au Electroplate |
| Example14 | 0.5 | — | 1.5 |
| Example15 | 1 | — | 1.5 |
| Example16 | 1.5 | — | 1.5 |
| Example17 | 3 | — | 1.5 |
| Example18 | 5 | — | 1.5 |
| Example19 | 6.5 | — | 1.5 |
| Comparative Example 5 | 0.3 | — | 1.5 |
| Comparative Example 6 | 7.5 | — | 1.5 |
| Comparative Example 7 | 5 | 5 | 1.5 |

In Comparative Example 5, a pinhole on the plate film was observed, and the subsequent evaluation was not performed. For the obtained plated products, the peel strength was measured. As a result, in all plated products, the peel strength was 80 N/cm or higher. Furthermore, the obtained plated products were heated at a temperature of 400° C. under the atmosphere for 10 minutes, and thereafter, the plate surface was observed. As a result, in Examples 14-19 and Comparative Example 7, the generation of a blister on the plate surface was recognized. In Comparative Example 6, the generation of a blister on the plate surface was observed. Further, in Examples 14-19, after 1000 cycles of a heat cycle of −65° C. to 175° C., the generation of a crack on the plate surface was not recognized, but in Comparative Example 7, the generation of a crack on the plate surface was recognized.

Examples 20-23, Comparative Examples 8, 9

A commercially available high-purity diamond powder A (Diamond Innovations, Inc./average particle diameter: 130 μm) and a high-purity diamond powder B (Diamond Innovations, Inc./average particle diameter: 15 μm) were mixed at a weight ratio shown in Table 4. As a result of the particle size distribution measurement of the mixed powder of the diamond powder A and the diamond powder B, the first peak was at 15 μm and the second peak was at 130 μm in the volume distribution. The ratio between the area of the volume distribution at 1-35 μm and the area of the volume distribution at 45-205 μm in the volume distribution is the value shown in Table 4. In the measurement of the particle size distribution, a slurry was made as a measurement solution, by adding the diamond powders in pure water. Then, the measurement was performed by a spectrophotometer (Beckman Coulter, Inc.: Coulter LS230). The refraction index of the water was 1.33 and the refraction index of the diamond was 2.42.

TABLE 4

| | Weight Ratio of Diamond Powders | | |
|---|---|---|---|
| | Diamond Powder A | Diamond Powder B | Area Ratio in Volume Distribution |
| Example20 | 6 | 4 | 4:6 |
| Example21 | 7 | 3 | 3:7 |
| Example22 | 8 | 2 | 2:8 |
| Example23 | 9 | 1 | 1:9 |
| Comparative Example 8 | 5 | 5 | 5:5 |

TABLE 4-continued

Weight Ratio of Diamond Powders

| | Diamond Powder A | Diamond Powder B | Area Ratio in Volume Distribution |
|---|---|---|---|
| Comparative Example 9 | 3 | 7 | 7:3 |

Note)
The area ratio in the volume distribution means the ratio between the area of the volume distribution at 1-35 μm and the area of the volume distribution at 45-205 μm in the volume distribution.

After 50 g of the obtained mixed powder, 16 g of silica powder (average particle diameter: 5 μm), and 16 g of silicon powder (average particle diameter: 10 μm) were mixed, this is filled into a crucible made of silicon carbide, and heating was performed at a temperature of 1450° C. under an argon atmosphere for 3 hours. Thereby, a diamond powder in which a β-silicon carbide layer was formed on the diamond powder surface was made.

An aluminum-diamond composite body was made in the same way as Example 1, except that the diamond powder in which the β-silicon carbide layer was formed on the surface was used as the diamond powder, and that the diamond powder with pure aluminum foils having a thickness of 0.045 mm disposed on upper and lower sides thereof was used for filling such that both surfaces were sandwiched between the mold release plates 8, so that a structure was formed.

For the obtained aluminum-diamond composite body, the same polishing and machining as Example 1 were performed, so that an aluminum-diamond composite body machined into a shape of 25×25×2 mmt was obtained. A cross-section of the aluminum-diamond composite body was observed by an industrial microscope, and the average thickness of the surface layers (reference numeral 4 in FIG. 1) on both surfaces was measured. As a result, the average thickness of the surface layer 4 was 0.045 mm. Further, the surface roughness (Ra) measured by a surface roughness meter is shown in Table 5.

Furthermore, for the obtained aluminum-diamond composite body, the same characteristic evaluation as Example 1 was performed. The results are shown in Table 5. In Comparative Examples 8, 9, the thermal conductivity was 400 W/mK or lower, and the thermal expansion coefficient was $10.0 \times 10^{-6}$/K or higher.

TABLE 5

| | Surface Roughness/ Ra | Thermal Conductivity (W/mK) | Thermal Expansion Coefficient (×10⁻⁶/K) | Vf (vol %) |
|---|---|---|---|---|
| Example 20 | 0.28 | 570 | 7.2 | 61 |
| Example 21 | 0.28 | 600 | 7 | 63 |
| Example 22 | 0.28 | 590 | 7.1 | 62.5 |
| Example 23 | 0.35 | 565 | 7.4 | 58 |
| Comparative Example 8 | 0.3 | 397 | 10.4 | 45.5 |
| Comparative Example 9 | 0.32 | 392 | 10.8 | 41.5 |

Further, ultrasonic cleaning of the above aluminum-diamond composite body was performed, and then, pretreatment with the Zn catalyst was performed. Thereafter, the Ni electroplating and the Au electroplating were performed. Thereby, plate layers having a thickness of 6.5 μm (Ni: 2.0 μm+Au: 2.5 μm) were formed on the surfaces of the aluminum-diamond composite bodies according to Examples 20-23. For the obtained plated products, the peel strength was measured by the same method as Example 1. As a result, in all plated products, the peel strength was 80 N/cm or higher. Furthermore, the obtained plated product was heated at a temperature of 400° C. under the atmosphere for 10 minutes, and thereafter, the plate surface was observed. As a result, an abnormity such as a blister was not recognized. Further, after 1000 cycles of a heat cycle of −65° C. to 175° C. (in an air tank, each temperature was kept for 30 minutes), the generation of a crack on the plate surface was not recognized.

Examples 24-30, Comparative Examples 10-12

An aluminum-diamond composite body was made in the same way as Example 1, except that the diamond powder with insertion members having a thickness shown in Table 6 disposed on upper and lower sides thereof was used for filling such that both surfaces were sandwiched between the mold release plates 8 so that a structure was formed, in Example 1. In Examples 29, 30, alumina fibers (DENKA ALCEN BOARD manufactured by Denka Company Limited/product type: BD-1600 and BD-1700LN) were used, and in Comparative Example 12, an alumina fiber (DENKA ALCEN BOARD manufactured by Denka Company Limited/product type: BD-1700) was used. The alumina fiber was crushed by a pressing machine such that the bulk density was 1.1 g/cm³, and the resulting matter was disposed as the insertion member. As a result of the particle size distribution measurement of the used diamond powder, the first peak was at 15 μm and the second peak was at 130 μm in the volume distribution. The ratio between the area of the volume distribution at 1-35 μm and the area of the volume distribution at 45-205 μm in the volume distribution was 3:7. In the measurement of the particle size distribution, a slurry was made as a measurement solution, by adding the diamond powders in pure water. Then, the measurement was performed by a spectrophotometer (Beckman Coulter, Inc.: Coulter LS230). The refraction index of the water was 1.33 and the refraction index of the diamond was 2.42.

For the obtained aluminum-diamond composite body, the same polishing and machining as Example 1 were performed, so that an aluminum-diamond composite body machined into a shape of 25×25×2 mmt was obtained. A cross-section of the aluminum-diamond composite body was observed by an industrial microscope, and the average thickness of the surface layers (reference numeral 4 in FIG. 1) on both surfaces was measured, the results of which and the surface roughness (Ra) measured by a surface roughness meter are shown in Table 6.

Furthermore, for the obtained aluminum-diamond composite body, the same characteristic evaluation as Example 1 was performed. The results are shown in Table 6.

TABLE 6

|  | Insertion Material | Thickness of Insertion Material (mm) | Average Thickness of Surface layer (mm) | Surface Roughness Ra (μm) | Thermal Conductivity (W/mK) | Thermal Expansion Coefficient (×10⁻⁶/K) | Vf (vol %) |
|---|---|---|---|---|---|---|---|
| Example 24 | Pure aluminum foil | 0.035 | 0.040 | 0.32 | 570 | 7.0 | 62.5 |
| Example 25 | Pure aluminum foil | 0.050 | 0.055 | 0.3 | 570 | 7.0 | 62 |
| Example 26 | Pure aluminum foil | 0.100 | 0.100 | 0.32 | 562 | 7.2 | 61 |
| Example 27 | Pure aluminum foil | 0.150 | 0.155 | 0.28 | 562 | 7.5 | 60.5 |
| Example 28 | Pure aluminum foil | 0.200 | 0.200 | 0.25 | 530 | 7.9 | 55.5 |
| Example 29 | Alumina fiber (porosity: 86%) | 0.100 | 0.100 | 0.35 | 555 | 7.5 | 61 |
| Example 30 | Alumina fiber (porosity: 90%) | 0.150 | 0.150 | 0.38 | 560 | 7.6 | 60 |
| Comparative Example 10 | Pure aluminum foil | 0.005 | 0.005 | 0.3 | 589 | 7.0 | 63 |
| Comparative Example 11 | Pure aluminum foil | 0.250 | 0.250 | 0.3 | 395 | 10.3 | 48 |
| Comparative Example 12 | Alumina fiber (porosity: 70%) | 0.100 | 0.100 | 1.3 | 545 | 7.5 | 61 |

In Comparative Example 11, the content of the diamond particles was 50 vol % or less, the thermal conductivity was 400 W/mK or lower, and the thermal expansion coefficient was $10.0 \times 10^{-6}$/K or higher. In Comparative Example 12, the surface roughness after the polishing treatment was large, and a polishing flaw was generated by the desorption of the ceramic fiber.

Further, ultrasonic cleaning of the above aluminum-diamond composite body was performed, and then, pretreatment with the Zn catalyst was performed. Thereafter, the Ni electroplating and the Au electroplating were performed. Thereby, plate layers having a thickness of 6.0 μm (Ni: 2.0 μm+Au: 2.0 μm) were formed on the surfaces of the aluminum-diamond composite bodies according to Examples 24-28 and Comparative Example 10. In Comparative Example 10, plating incompletion was observed, and the subsequent evaluation was not performed. For the other obtained plated products, the peel strength was measured by the same method as Example 1. As a result, in all plated products, the peel strength was 80 N/cm or higher. Furthermore, the obtained plated product was heated at a temperature of 400° C. under the atmosphere for 10 minutes, and thereafter, the plate surface was observed. As a result, an abnormity such as a blister was not recognized. Further, after 1000 cycles of a heat cycle of −65° C. to 175° C. (in an air tank, each temperature was kept for 30 minutes), the generation of a crack on the plate surface was not recognized.

REFERENCE SIGNS LIST

1 Aluminum-diamond composite body
2 Surface metal layer
3 Composite part
4 Surface layer
5 Ni layer
6 Au layer
7 Mold member comprising porous body
8 Mold release plate on which mold release agent is applied
9 Diamond powder
10 Metal plate

The invention claimed is:

1. A heat dissipation component for a semiconductor element, the heat dissipation component comprising:
a composite part containing 50-80 vol % diamond powder with the remainder being composed of metal including aluminum, the diamond powder being a diamond powder in which a first peak of a volume distribution of particle diameter is at 5-25 μm and in which a second peak is at 55-195 μm, wherein a ratio between an area of a volume distribution at particle diameters of 1-35 μm and an area of a volume distribution at particle diameters of 45-205 μm is 1:9 to 4:6;
surface layers on both principal surfaces of the composite part, each of the surface layers containing 80 vol % or more metal including aluminum and having a film thickness of 0.03-0.2 mm; and
a surface metal layer provided on at least one of the surface layers;
wherein the surface metal layer consists of (1) a crystalline Ni plate layer and (2) an Au plate layer, the crystalline Ni plate layer has a film thickness of 0.5-6.5 μm, and the Au plate layer has a film thickness of 0.05 μm or larger.

2. The heat dissipation component for a semiconductor element according to claim 1, wherein the crystalline Ni plate layer and the Au plate layer are plating films that are formed by an electroplating method, and wherein peel strengths of the plating films are 50 N/cm or higher.

3. The heat dissipation component for a semiconductor element according to claim 1, wherein the composite part is an aluminum-diamond composite body produced by a squeeze casting method, the aluminum-diamond composite body having a thermal conductivity of 400 W/mK or higher at a temperature of 25° C., a linear thermal expansion coefficient of $5.0 \times 10^{-6}$-$10.0 \times 10^{-6}$/K at a temperature of 25-150° C., and a surface roughness (Ra) of the surface layers of 1 μm or less.

4. The heat dissipation component for a semiconductor element according to claim 1, wherein the composite part is an aluminum-diamond composite body in which a particle of the diamond powder contains a β-silicon carbide layer chemically bonded to a surface of the particle.

5. A semiconductor element composed of a semiconductor laser or a high-frequency element comprising GaN, GaAs, or SiC, wherein the semiconductor element comprises the heat dissipation component according to claim 1.

6. The heat dissipation component for a semiconductor element according to claim 2, wherein the composite part is an aluminum-diamond composite body produced by a squeeze casting method, the aluminum-diamond composite body having a thermal conductivity of 400 W/mK or higher at a temperature of 25° C., a linear thermal expansion coefficient of $5.0\times10^{-6}$-$10.0\times10^{-6}$/K at a temperature of 25-150° C., and a surface roughness (Ra) of the surface layers of 1 μm or less.

7. The heat dissipation component for a semiconductor element according to claim 2, wherein the composite part is an aluminum-diamond composite body in which a particle of the diamond powder contains a β-silicon carbide layer chemically bonded to a surface of the particle.

8. A semiconductor element composed of a semiconductor laser or a high-frequency element comprising GaN, GaAs, or SiC, wherein the semiconductor element comprises the heat dissipation component according to claim 2.

9. The heat dissipation component for a semiconductor element according to claim 6, wherein the composite part is an aluminum-diamond composite body in which a particle of the diamond powder contains a β-silicon carbide layer chemically bonded to a surface of the particle.

10. The semiconductor element according to claim 8, wherein the composite part of the heat dissipation component is an aluminum-diamond composite body produced by a squeeze casting method, the aluminum-diamond composite body having a thermal conductivity of 400 W/mK or higher at a temperature of 25° C., a linear thermal expansion coefficient of $5.0\times10^{-6}$-$10.0\times10^{-6}$/K at a temperature of 25-150° C., and a surface roughness (Ra) of the surface layers of 1 μm or less.

11. The semiconductor element according to claim 8, wherein the composite part of the heat dissipation component is an aluminum-diamond composite body in which a particle of the diamond powder contains a β-silicon carbide layer chemically bonded to a surface of the particle.

12. The semiconductor element according to claim 10, wherein the composite part of the heat dissipation component is an aluminum-diamond composite body in which a particle of the diamond powder contains a β-silicon carbide layer chemically bonded to a surface of the particle.

13. The heat dissipation component for a semiconductor element according to claim 3, wherein the composite part is an aluminum-diamond composite body in which a particle of the diamond powder contains a β-silicon carbide layer chemically bonded to a surface of the particle.

14. The semiconductor element according to claim 5, wherein the composite part of the heat dissipation component is an aluminum-diamond composite body produced by a squeeze casting method, the aluminum-diamond composite body having a thermal conductivity of 400 W/mK or higher at a temperature of 25° C., a linear thermal expansion coefficient of $5.0\times10^{-6}$-$10.0\times10^{-6}$/K at a temperature of 25-150° C., and a surface roughness (Ra) of the surface layers of 1 μm or less.

15. The semiconductor element according to claim 5, wherein the composite part of the heat dissipation component is an aluminum-diamond composite body in which a particle of the diamond powder contains a β-silicon carbide layer chemically bonded to a surface of the particle.

16. The semiconductor element according to claim 1, wherein the composite part of the heat dissipation component is an aluminum-diamond composite body in which a particle of the diamond powder contains a β-silicon carbide layer chemically bonded to a surface of the particle.

* * * * *